US010530026B2

(12) United States Patent
Howard et al.

(10) Patent No.: US 10,530,026 B2
(45) Date of Patent: Jan. 7, 2020

(54) PCB EMBEDDED TUNABLE MICROWAVE FILTER WITH TEMPERATURE COMPENSATION

(71) Applicant: M-Tron Industries, Inc, Orlando, FL (US)

(72) Inventors: Michael D Howard, Forest City, FL (US); Roger Paulsen, Prescott Valley, AZ (US)

(73) Assignee: M-TRON INDUSTRIES, INC., Orlando, FL (US)

( * ) Notice: Subject to any disclaimer, the term of this patent is extended or adjusted under 35 U.S.C. 154(b) by 0 days.

(21) Appl. No.: 15/819,587

(22) Filed: Nov. 21, 2017

(65) Prior Publication Data

US 2018/0145385 A1 May 24, 2018

Related U.S. Application Data

(60) Provisional application No. 62/424,639, filed on Nov. 21, 2016.

(51) Int. Cl.
*H01P 1/207* (2006.01)
*H01P 3/08* (2006.01)
*H05K 1/18* (2006.01)
*H01P 1/30* (2006.01)
*H05K 1/02* (2006.01)
*H01P 1/208* (2006.01)
*H05K 1/16* (2006.01)

(52) U.S. Cl.
CPC ............ *H01P 1/207* (2013.01); *H01P 1/2088* (2013.01); *H01P 1/30* (2013.01); *H01P 3/08* (2013.01); *H05K 1/0201* (2013.01); *H05K 1/0237* (2013.01); *H05K 1/0239* (2013.01); *H05K 1/16* (2013.01); *H05K 1/181* (2013.01); *H05K 1/0262* (2013.01); *H05K 2201/09063* (2013.01); *H05K 2201/10015* (2013.01); *H05K 2201/10151* (2013.01); *H05K 2203/165* (2013.01)

(58) Field of Classification Search
CPC ........... H01P 1/30; H01P 3/08; H05K 1/0237; H05K 1/181; H05K 2201/10015; H05K 2201/10151
USPC ........................................................ 333/205
See application file for complete search history.

(56) References Cited

U.S. PATENT DOCUMENTS 5,157,364 A * 10/1992 Pond ................... H01P 1/20336
333/203

FOREIGN PATENT DOCUMENTS

WO WO-2007149046 A1 * 12/2007 ............. H01L 23/66

* cited by examiner

*Primary Examiner* — Robert J Pascal
*Assistant Examiner* — Kimberly E Glenn
(74) *Attorney, Agent, or Firm* — Husch Blackwell LLP

(57) ABSTRACT

A filter of the present invention creates a cavity filter that can be embedded within the inner layers of a printed circuit board. The embodiment can provide for a tunable microwave filter with lower loss, lower manufacturing cost and higher production yields. In addition, the tunable microwave includes a temperature compensation means to accommodate an electrical characteristic of filter with regard to the temperature variation. Such temperature compensation embodiment can be embedded into the upper layer communicably associated with the processor. For performing intelligent temperature compensation, the processor can include a look-up table of tuning values for controlling can store a set of temperature offset value that can modify the tuning table.

20 Claims, 10 Drawing Sheets

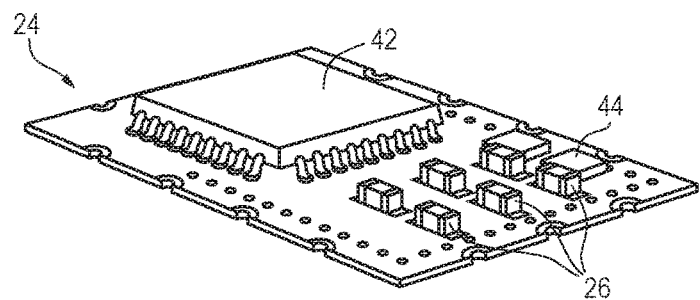
FIG. 6A
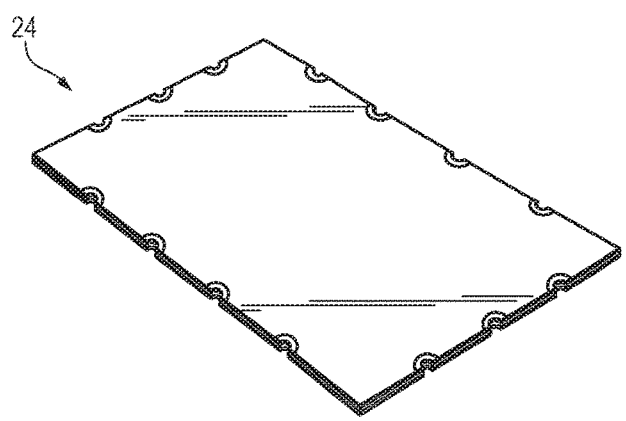
FIG. 6B
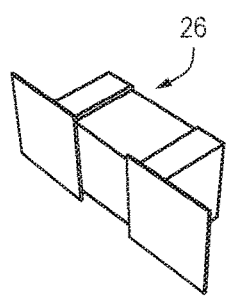 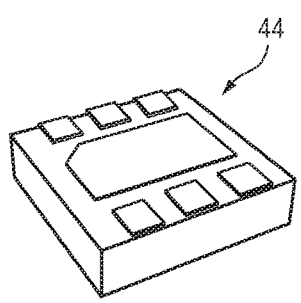 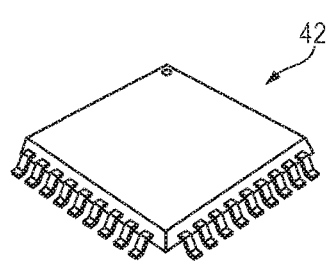
FIG. 6C   FIG. 6D   FIG. 6E

PCB EMBEDDED TUNABLE MICROWAVE FILTER WITH TEMPERATURE COMPENSATION

CROSS-REFERENCE TO RELATED APPLICATIONS

This Application clam priority to U.S. Provisional Application Ser. No. 62/424,639, filed on Nov. 21, 2016, entitled "PCB Embedded Tunable Microwave Filter with Temperature Compensation," the entire disclosure of which is incorporated herein by reference.

FIELD OF INVENTION

The present invention relates generally to microwave filters, and more particularly, to the PCB embedded tunable filters with applying temperature compensation technology.

BACKGROUND OF THE INVENTION

Common types of filters currently known in the art have not been particularly suited for these desired improvements. LC filters can be low cost and tunable, but have high loss and become too small to be practical at microwave frequencies. Surface acoustic wave (SAW) filters work well at microwave frequencies, but they are not tunable.

Planar filters and cavity filters appear to provide the best option for narrowband filters at microwave frequencies. They have better performance and lower loss when the resonators are surrounded by air instead of lossy dielectric material. A conventional, air dielectric, filter of these types would be constructed using an expensive machined-metal housing. This invention constructs the metalized features of a microwave filter an air cavity embedded in the interior layers of a multilayer printed circuit board. Also, microwave filters may be tuned to frequency by the addition of reactance to the circuit. In a conventional, machined-housing filter it is difficult to attach tuning elements to the ends of the resonators because the resonators are suspended in air. In this invention, as the construction uses printed circuit fabrication, tuning elements are easily added external to the air cavity and connected by metalized features of the circuit board to the inner filter structure. This further enables the additional assembly required to construct a tunable filter, inclusive of control circuitry. This invention enables the construction of high performance low cost fixed or tunable filters.

Tunable microstrip combline filters can be designed on the surface layers of a printed circuit board and the tuning reactance can be attached to the resonators using copper traces on the circuit board. Planar combline filters have also been embedded into inner layers of circuit boards using stripline technology. This allows the tuning elements to be soldered to the top layer of the circuit board and connected to the resonators by via holes. These types of filters can be fixed or tunable, but can be very lossy because the filter resonators are surrounded by lossy dielectric material.

Research and development of Substrate Integrated Waveguide (SIW) filters has been conducted over the past several years to address the problems mentioned above. Waveguide filters are high performance filters that can be tunable, but they are costly and large in size. SIW filters were developed to implement waveguide filters within a printed circuit board substrate. The ultimate goal of this effort was to reduce the size and cost of the filters. These filters have achieved their goals of smaller size and lower cost, but they suffer from higher loss because of the lossy dielectric material of the circuit board. However, SIW filters cannot achieve size reduction without the use of dielectric material. The electrical properties of the dielectric material reduce the wavelengths of the electro-magnetic waves within the material. But because the dielectric material is lossy, the size reduction that is achieved comes at a cost, which is additional signal loss in the dielectric material.

Accordingly, a need exists for a filter that functions well at microwave frequencies, can achieve narrow bandwidths, can achieve low signal loss and, if so needed, can be tunable. A need also exists for such a filter that can be constructed with reduced size and at reduced costs. Yet a further need exists for such a filter that can be easily and efficiently assembled without difficult structuring and soldering.

SUMMARY OF THE INVENTION

The present invention is directed at creating a filter by embedding air cavities and conducting elements into the inner layers of a printed circuit board. The conducting element may be fabricated as part of the circuit board. Namely, in order to permit the utilization of a circuit board, the cavity is left vacant through a printed circuit board (PCB) fabrication and filter structure added as an independently manufactured item. By this means an embedded cavity printed circuit board design may support multiple filter designs. The elements are positioned within the cavity to form the resonators of a filter. A conducting path or trace can connect one end of each resonator to pads on the top of the circuit board filter. A reactance can be soldered to these pads, loading the resonators and setting the resonant frequency of each resonator. The reactance can be fixed for a fixed frequency filter or variable for a frequency tunable filter. This completes the filter. The filter can be tunable by means of a control logic and a temperature control means, which together can adjust the voltage or number of capacitors in order to account for changes in temperature and maintain an approximately constant center frequency.

The filter of the present invention creates a cavity filter that can be embedded within the inner layers of a PCB. Because the resonators are in a cavity filled with air instead of dielectric material, the loss through the filter can be much lower. This embodiment can provide for a tunable microwave filter with lower loss, lower manufacturing cost and higher production yields. Such a filter can provide the following advantages: lower signal loss with the use of an air cavity; easy assembly with the availability of the majority of parts being placed by a machine and reflow solder rather than hand soldering; in the instance of filter structure being a part of the PCB without soldering of small wires to resonators; parts placement and soldering that can be well controlled and repeatable; increased production yields; lower cycle times; no additional sub-assembly requirement; the control circuitry parts and components can be mounted on the top layer of the PCB; and achievement of mechanical stability under vibration for the resonator rods. In addition, the tunable microwave filter of the present invention includes a temperature compensation means to accommodate an electrical characteristic of filter with regard to the temperature variation. The temperature compensation means coupled to a temperature sensor can adjust the electrical characteristics, such as capacitance, reactance, and center frequency of cutoff, by adjusting feedback DC voltage. Such temperature compensation embodiment can be embedded into the top layer communicably associated with the programmable control logic component. For performing intelligent temperature compensation, the control logic component can include a look-up table of tuning values for controlling can store a set of temperature offset value that can modify the tuning look-up table. Further, since the construction of the invention uses printed circuit fabrication, the tuning elements are easily added externally to the air cavity and connected by metalized features of the circuit board to the inner filter structure. This construction provides for a low cost, but a high performance fixed or tunable filter.

DESCRIPTION OF THE SEVERAL VIEWS OF THE DRAWING

In the accompanying drawing, which forms a part of the specification and is to be read in conjunction therewith in which like reference numerals are used to indicate like or similar parts in the various views:

FIG. 6A is a perspective view of a top component layer for a PCB embedded filter illustrating components connected to the top component layer in accordance with one embodiment of the present invention;

FIG. 6B is a perspective view of the PCB of the top component layer of FIG. 6A;

FIG. 6C is a perspective view of a capacitor component of the top component layer of FIG. 6A;

FIG. 6D is a perspective view of a RF component of the top component layer of FIG. 6A;

FIG. 6E is a perspective view of a QFP component of the top component layer of FIG. 6A.

DETAILED DESCRIPTION OF THE INVENTION

Figure 1A:
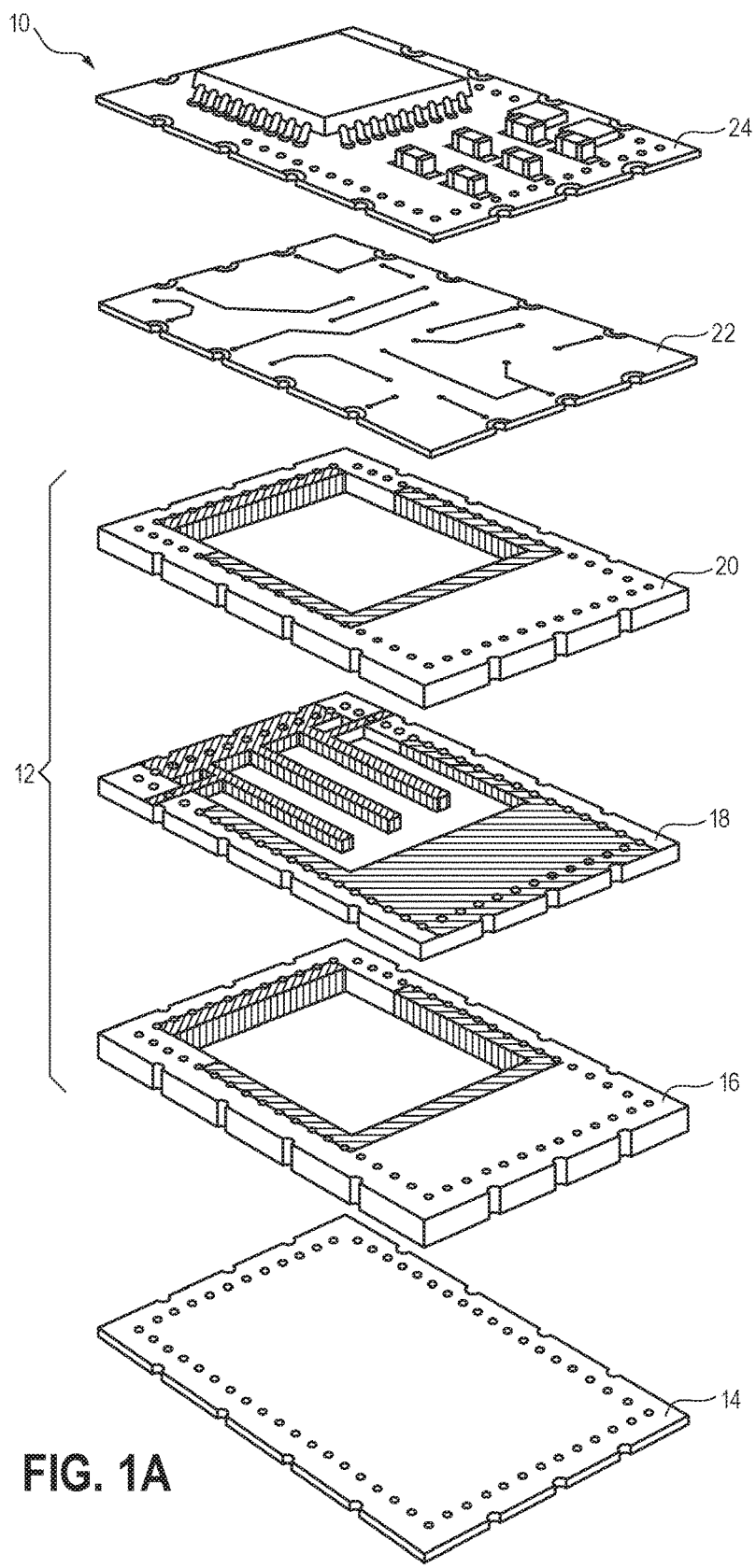
FIG. 1A is an exploded perspective view of a PCB embedded filter in accordance with one embodiment of the present invention.

Embodiments of the present invention will now be described with reference to the drawing figures, in which like reference numerals refer to like parts throughout. For purposes of clarity in illustrating the characteristics of the present invention, proportional relationships of the elements have not necessarily been maintained in the drawing figures.

Generally, it is understood that the drawings and the various elements depicted therein are not drawn to scale. Further, relative terms, such as "above," "below," "top," "bottom," "upper," "lower," "left." "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal." Further as used in the specification and appended claims, the terms "a", "an" and "the" include both singular and plural referents, unless the context clearly dictates otherwise. Thus, for example, "a device" includes one device and plural devices.

The following detailed description of the invention references specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The present invention is defined by the appended claims and the description is, therefore, not to be taken in a limiting sense and shall not limit the scope of equivalents to which such claims are entitled.

Figure 1B:
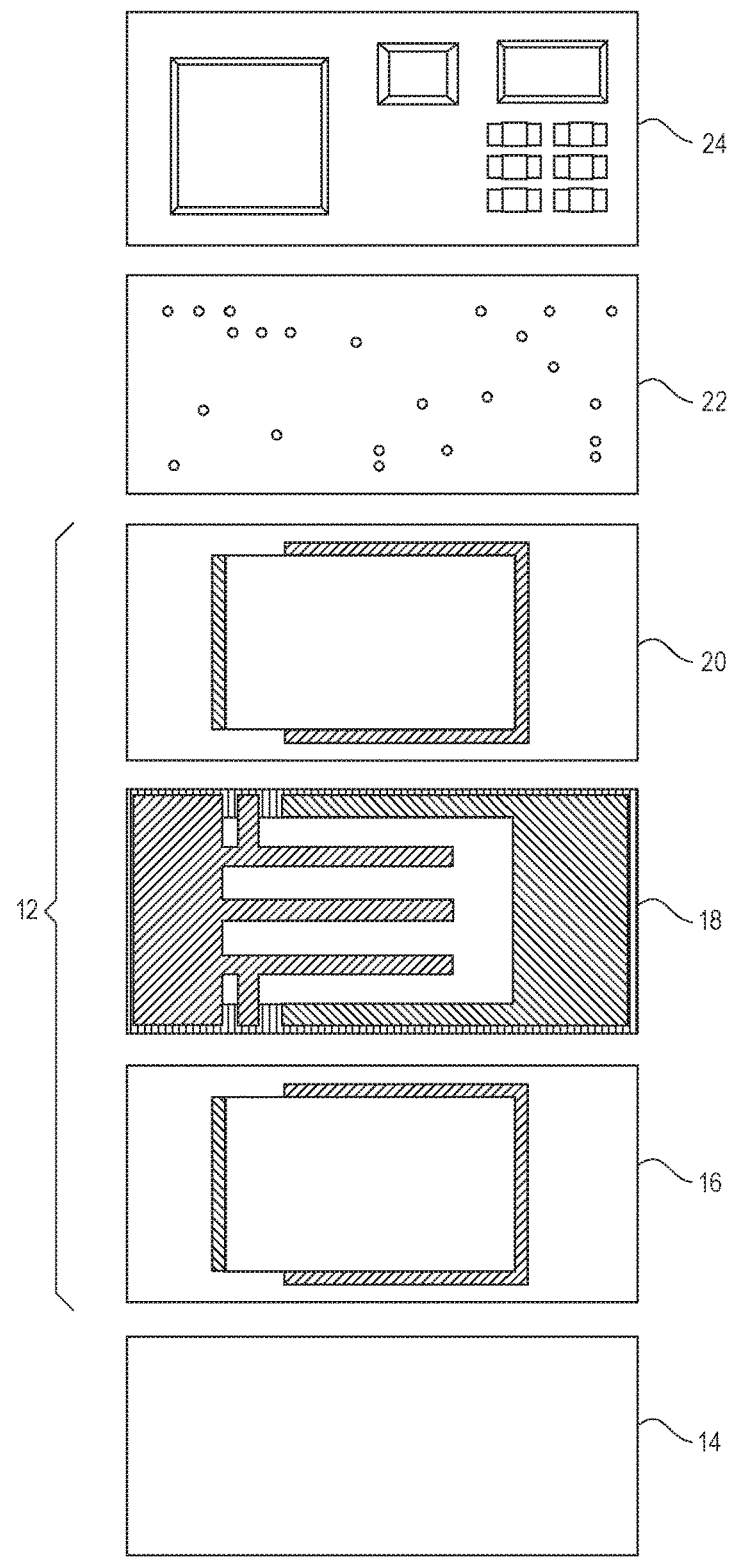
FIG. 1B is a plan view of a PCB embedded combline filter in accordance with one embodiment of the present invention.

The present invention is directed generally to a printed circuit board embedded filter 10 as best illustrated in FIG. 1A and FIG. 1B. Filter 10 can be constructed by embedding a combline filter 12 within the inner layers of a printed circuit board (PCB) as shown in FIG. 1A and described in greater detail below. Combline filter 12 can be constructed through one or more air cavities having conducting rods placed therein.

Turning to FIG. 1A and FIG. 1B, filter 10 can comprise a series of layers forming the PCB with a combline filter 12 in its interior. Filter 10 can comprise combline filter 12, a bottom component layer 14, a routing layer 22, and a top (cover) component layer 24. Combline filter 12 can comprise a lower cavity layer 16, a middle cavity layer 18, and an upper cavity layer 20. In the present embodiment, some layers can be comprised a conductive section and a non-conductive section. For example, as shown in FIG. 1B, middle cavity layer 18 includes conductive sections 28 and non-conductive sections 30. Conductive sections 28 of middle cavity layer 18 coupled to lower cavity layer 16 and upper cavity layer 20. As shown in FIG. 1A, FIG. 1B, and FIG. 6A, top component layer 24 can have one or more capacitance component 26 connected thereto and connected to middle cavity layer 18 by means of a conducting path or conducting wire. Collectively, one or more capacitance component 26 along with middle cavity layer 18 and cavity layers 16 and 20 can form a function of combline filter 12.

Figure 2A:
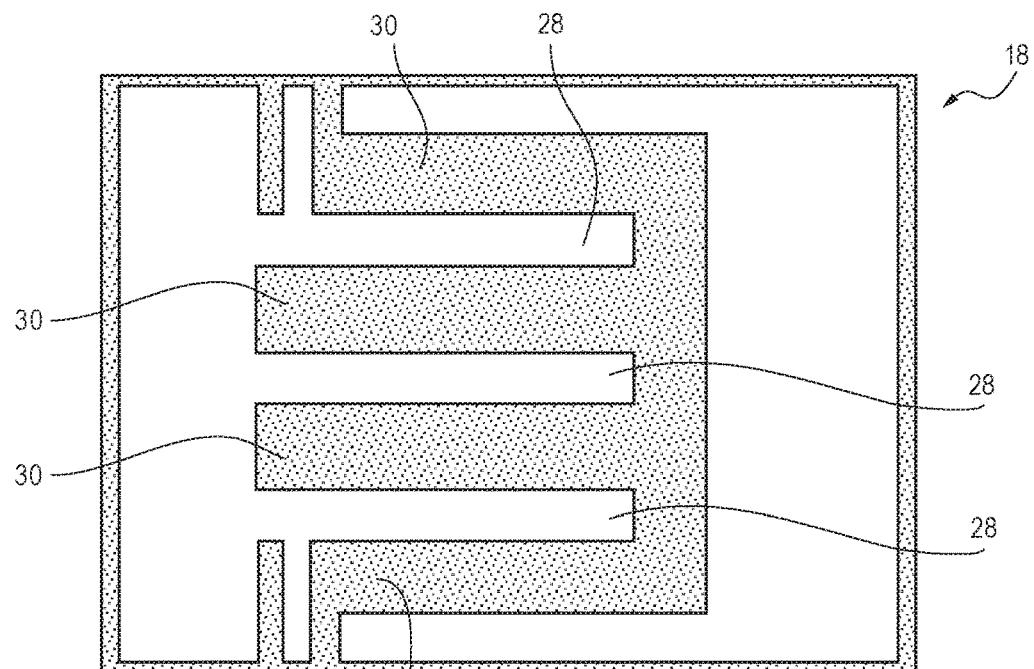
FIG. 2A is a plan view of a resonator layer for a PCB embedded filter illustrating a first phase of fabrication in accordance with one embodiment of the present invention.
Figure 2B:
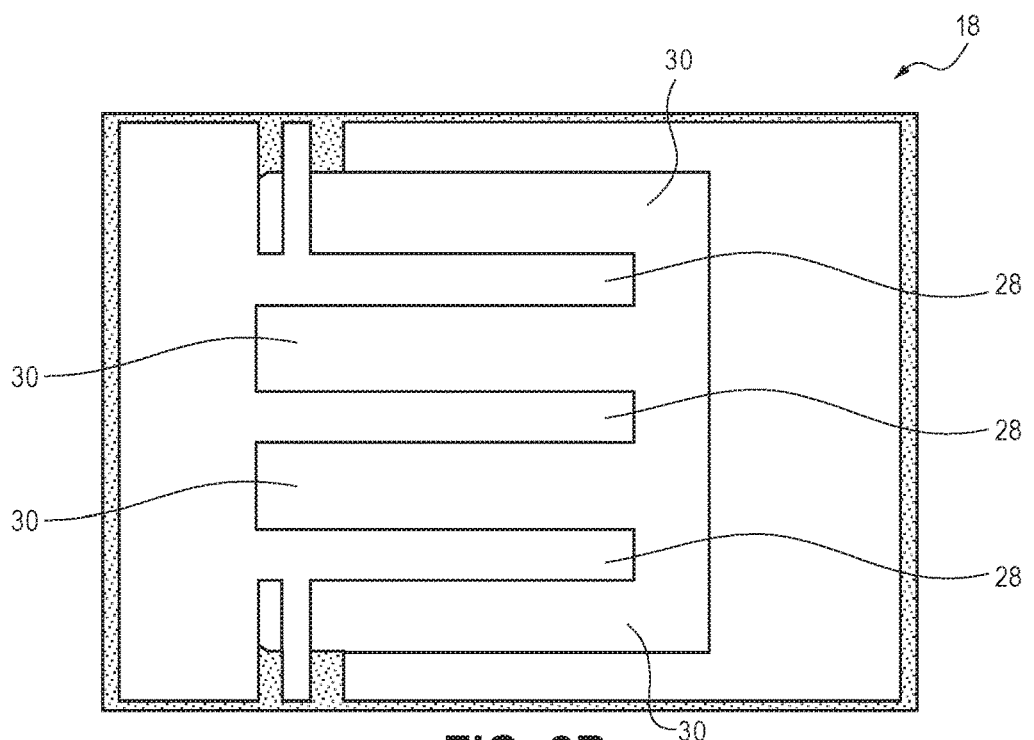
FIG. 2B is a plan view of the resonator layer of FIG. 2A illustrating a second phase of fabrication in accordance with one embodiment of the present invention.
Figure 2C:
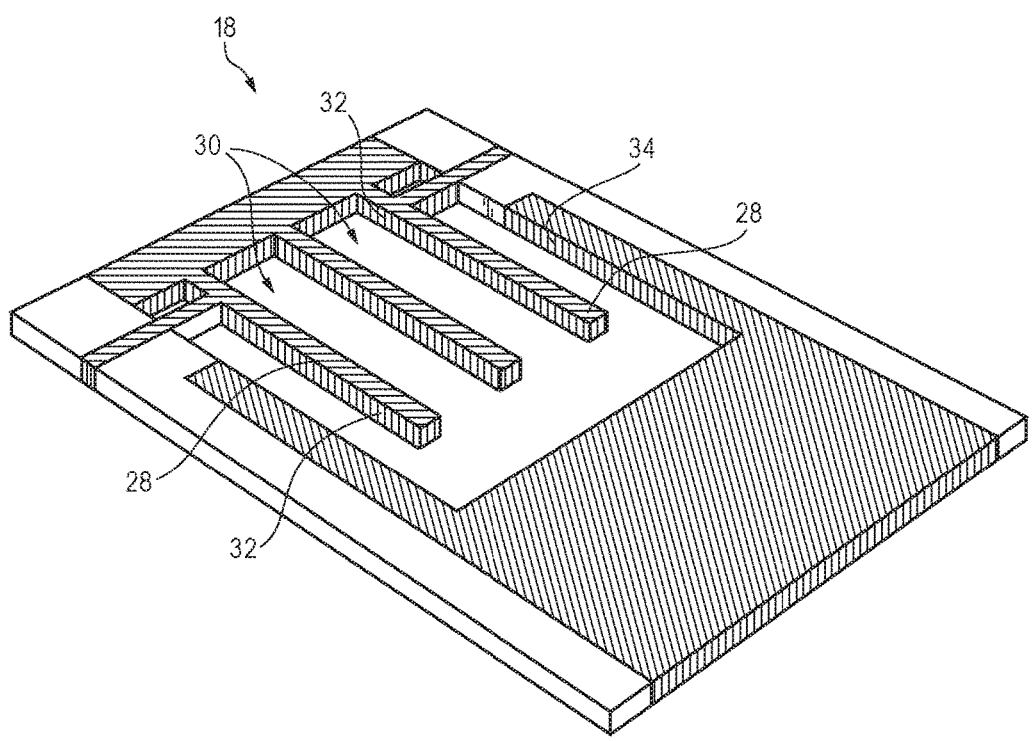
FIG. 2C is a perspective view of a resonator layer for a PCB embedded filter in accordance with one embodiment of the present invention.

FIGS. 2A-2C illustrate the fabrication of middle cavity layer 18 according to one embodiment of the present invention. Middle cavity layer 18 can comprise a plurality of rods or resonators 28 adjacent one or more air gaps 30, both of which can be fabricated by using a piece of two-sided laminate material that has copper (or other conductive materials) on each side. Combline shaped middle cavity layer 18 can be etched into the copper to define resonators 28, and the board material between and around resonators 28 can be removed with a router or other suitable device or method. The areas where the board material is removed can form air gaps 30. FIG. 2A illustrates middle cavity layer 18 after the shape of rods or resonators 28 are etched from the metallic copper (or other conductive material) layer laminated onto a substrate (or other non-conductive material) layer. FIG. 2B illustrates middle cavity layer 18 after a certain area of the substrate layer has been removed. FIG. 2C illustrates middle cavity layer 18 once it has been fully fabricated according to one embodiment of the present invention. As best shown in FIG. 2C, side walls 32 of resonators 28 and air gap walls 34 of air gaps 30 can be an edge plated after routing.

Figure 3A:
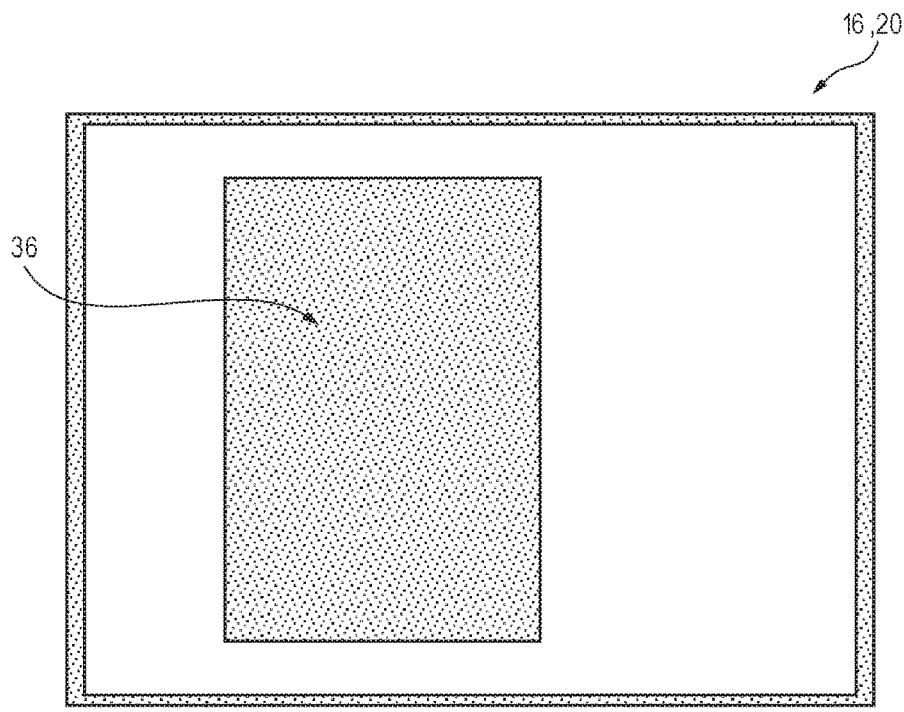
FIG. 3A is a plan view of a cavity layer for a PCB embedded filter illustrating a first phase of fabrication in accordance with one embodiment of the present invention.
Figure 3B:
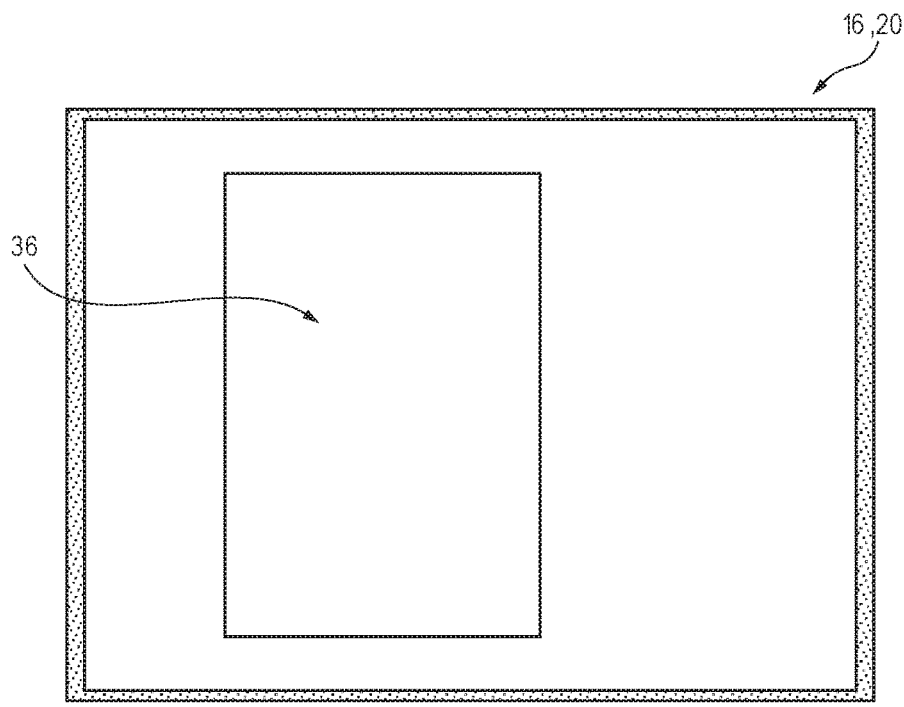
FIG. 3B is a plan view of the cavity layer of FIG. 3A illustrating a second phase of fabrication in accordance with one embodiment of the present invention.
Figure 3C:
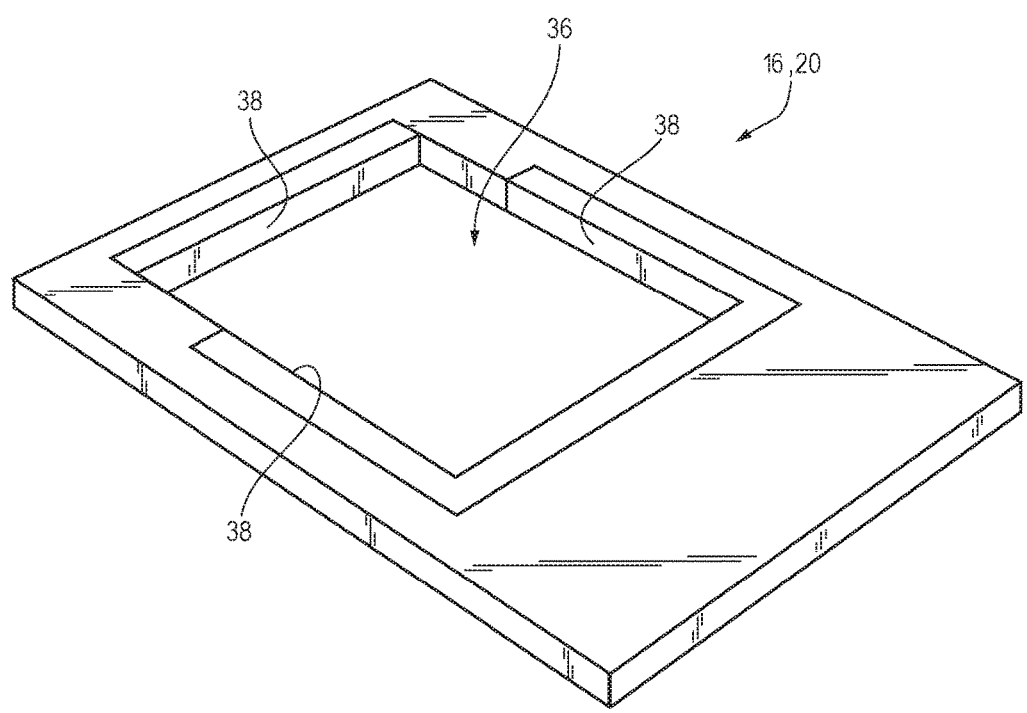
FIG. 3C is a perspective view of a cavity layer for a PCB embedded filter in accordance with one embodiment of the present invention.

FIGS. 3A-3C illustrate the fabrication of the lower and upper air cavity layers 16 and 20, respectively. Each layer 16 and 20 can have an opening 36 defined therein, as best shown in FIG. 3C, which collectively, along with air gaps 30 of middle cavity layer 18, form the air cavity of combline filter 12. The fabrication process for these layers 16 and 20 can be performed in a manner similar to middle cavity layer 18. Each layer 16 and 20 can be fabricated from a two-sided laminate material having metallic copper (or other conductive material) on each side. Opening 36 of the layer (16 or 20) can be etched from the metallic copper (or other conductive material) layer laminated onto the substrate layer (or other non-conductive layer), and a certain area of the board material within opening 36 can be removed. FIG. 3A illustrates lower and upper air cavity layers 16 and 20 after the shape of opening 36 has been etched from the metallic copper (or other conductive material) layer laminated onto the substrate (or other non-conductive material) layer. FIG. 3B illustrates lower and upper air cavity layers 16 and 20 after the certain area of the board material has been removed. FIG. 3C illustrates lower or upper air cavity layer 16 or 20 fully fabricated in accordance with one embodiment of the present invention. As best shown in FIG. 3C, side walls 38 of opening 36 can be the edge plated after routing.

Figure 4A:
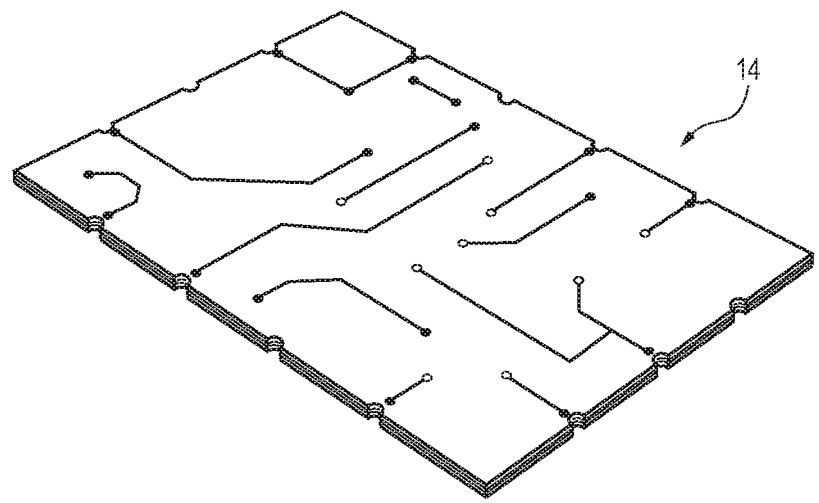
FIG. 4A is a perspective view of a bottom component layer for a PCB embedded filter illustrating a first side of the bottom component layer in accordance with one embodiment of the present invention.
Figure 4B:
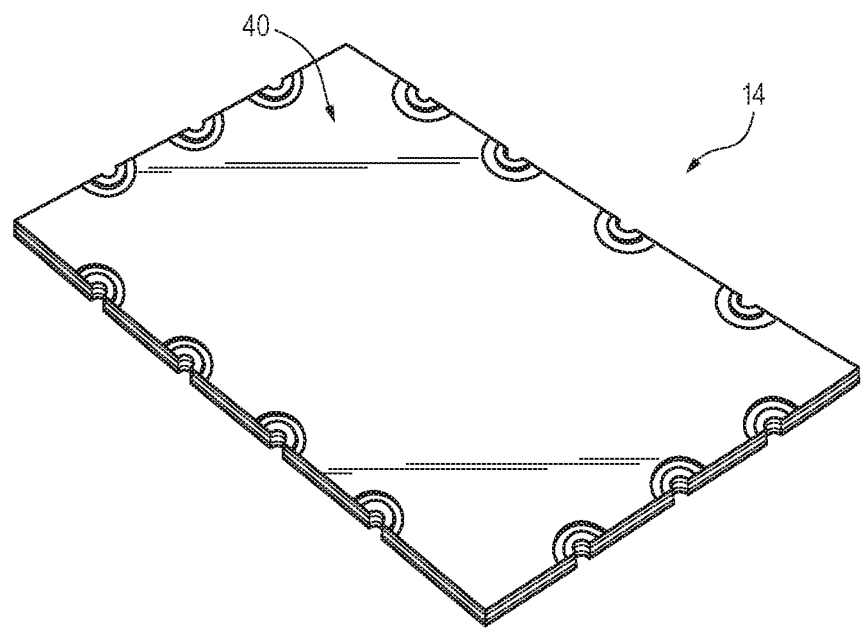
FIG. 4B is a perspective view of the bottom component layer of FIG. 4A illustrating a second side of the bottom component layer in accordance with one embodiment of the present invention.
Figure 5A:
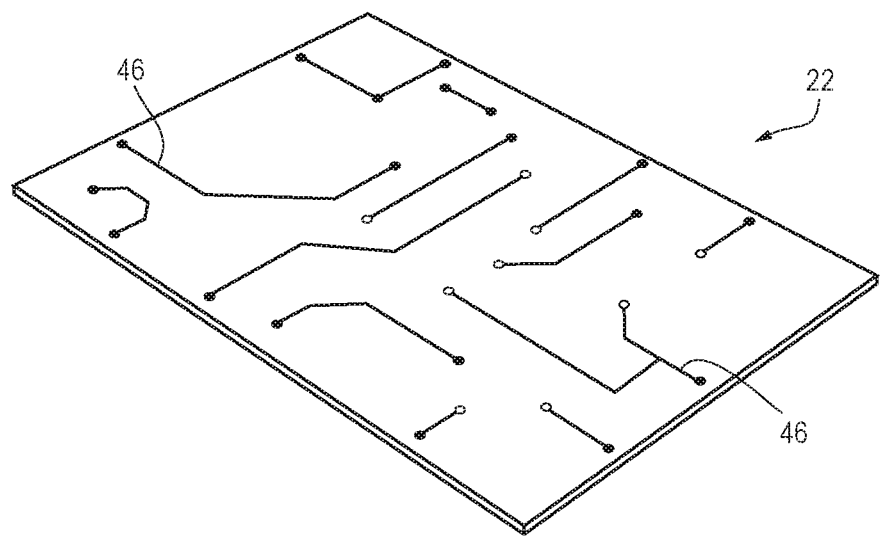
FIG. 5A is a perspective view of a routing component layer for a PCB embedded filter illustrating a first side of the routing component layer in accordance with one embodiment of the present invention.
Figure 5B:
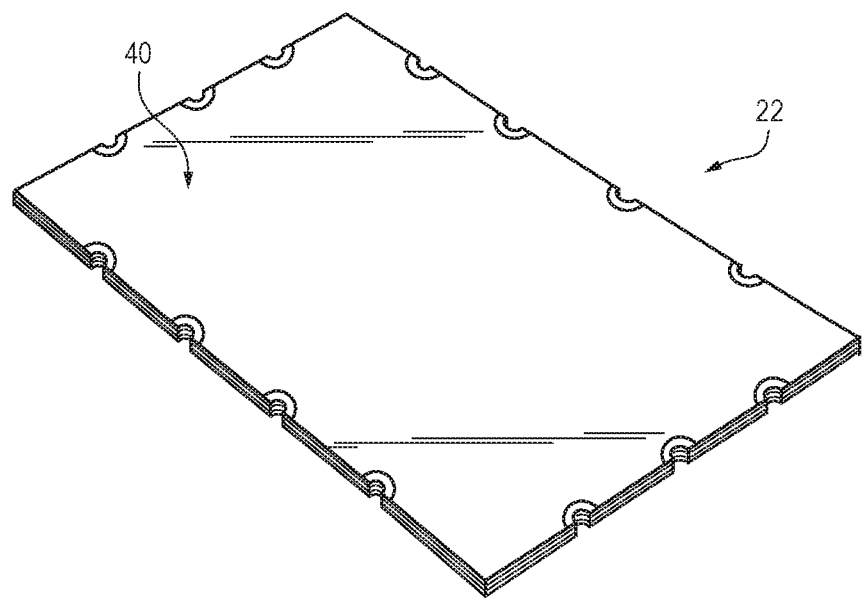
FIG. 5B is a perspective view of the routing component layer of FIG. 5A illustrating a second side of the routing component layer in accordance with one embodiment of the present invention.

FIGS. 4A and 4B illustrate bottom component layer 14 in accordance with one embodiment of the present invention. Bottom layer 14 can comprise a piece of board material having the metallic copper (or other conductive material) layer 40 on one side as shown in FIG. 4B. After fabrication of layers 16-20, bottom component layer 14 can be positioned below lower air cavity layer 16 with copper side 40 facing upward. Similarly, FIGS. 5A and 5B illustrate intermediate routing component layer 22 in accordance with one embodiment of the present invention, which can comprise a piece of board material having a similar metallic copper layer 40 on one side as shown in FIG. 5B. Routing component layer 22 can be positioned above upper air cavity layer 20 with copper side 40 facing downward toward upper cavity layer 20 as best shown in FIGS. 1A and 1B.

FIGS. 6A-6E illustrate top component layer 24 along with the various components for tuning and controlling filter 10, including capacitance component 26, a QFP (quad-flat package) or surface mount chip component 42 and a RF surface mounted component 44. Capacitance component 26 can be any suitable capacitor depending on the particular embodiment of the present invention. For example, capacitance component 26 can be fixed capacitors or variable capacitors such as varactor diodes, MEMS (micro-electro-mechanical system) varactors or switched capacitor arrays depending on the desired functionality of filter 10 as described herein. Capacitance component 26, QFP component 42, and RF component 44 can be soldered to top layer 24 or otherwise connected to top layer 24 using other suitable means known in the art. Components 26, 42 and 44 can be connected within filter 10 by forming holes 46 extending from top layer 24 through remaining layers 14-22. Holes 46 can be coated or lined with copper (or other conductive material) in order to form a conductive path as shown on intermediate routing layer 22 of FIG. 5A. In particular, holes 46 can be used to electrically connect capacitance component 26 to resonators 28. Other means, such as conducting wires can also be used in alternative embodiments.

To construct filter 10, as best shown in FIG. 1, layers 14-24 can be placed together and laminated to form a completed printed circuit board filter 10. Layers 14-24 can be laminated and filter 10 can be fabricated using TTM or Viasystems processes. Once laminated together, lower and upper cavity layers 16 and 20 along with middle cavity layer 18 collectively form combline filter 12 with resonators 28 positioned within an air cavity formed by air gaps 30 and openings 36 and defined by copper layers 40 on bottom component layer 14 below and routing component layer 22 above.

In some applications, air cavity of combline filter 12 may be too large to laminate filter 10 in the manner described above. In order to resolve this limitation, bottom component layer 14 can have an opening (not shown) defined therein so that air will not be trapped in inner layers (layers 16-20) of filter 10 during lamination. To close the opening in bottom layer 14, a cap (not shown) can be installed into the opening, which is preferably done after components 26, 42 and 44 have been installed or connected to top layer 24.

Filter 10 (with the combline filter 12 inside) can be configured as a fixed frequency filter or a tunable filter depending on the particular embodiment of the present invention. For the fixed frequency filter, filter 10 can be constructed with capacitors having a fixed capacitance. Alternatively, if a variable capacitance is provided for filter 10, then it can be configured as tunable filter 10. The variable capacitance can be provided by any suitable type of variable capacitance component 26, such as varactor diodes, MEMS varactors and switched capacitor arrays. Any type of capacitive component can be used to tune filter 10 and the capacitance can be tuned electrically or mechanically. According to one embodiment, filter 10 can be tuned by changing the DC voltage applied to capacitance component 26 (in the case of variable capacitance) or by switching in different fixed capacitance component 26. As the capacitance changes, the resonator frequency changes. The value of capacitance can be set by a digital control logic 48 (diagrammatically shown in FIG. 7) that can receive external tuning commands and tunes filter 10 to the desired center frequency.

Filter 10 can include a temperature compensation means 50 to accommodate any temperature changes within filter 10. Filters in general, whether a fixed frequency filter or a tunable filter, can have sources of variation that can cause the center frequency of such to change with temperature based on the type of capacitive tuning element. For example, in the case of varactor diodes, the capacitance of the varactor diodes changes with temperature. The mechanical dimensions of the printed circuit board material in filter 10 can also change with temperature. Both can cause the center frequency of filter 10 to vary. According to one embodiment of the present invention, filter 10 can operate with any type of tuning element (capacitance component 26) and PCB material dimensions by accounting for the temperature change through temperature compensation means 50, as diagrammatically shown in FIG. 7.

Figure 7:
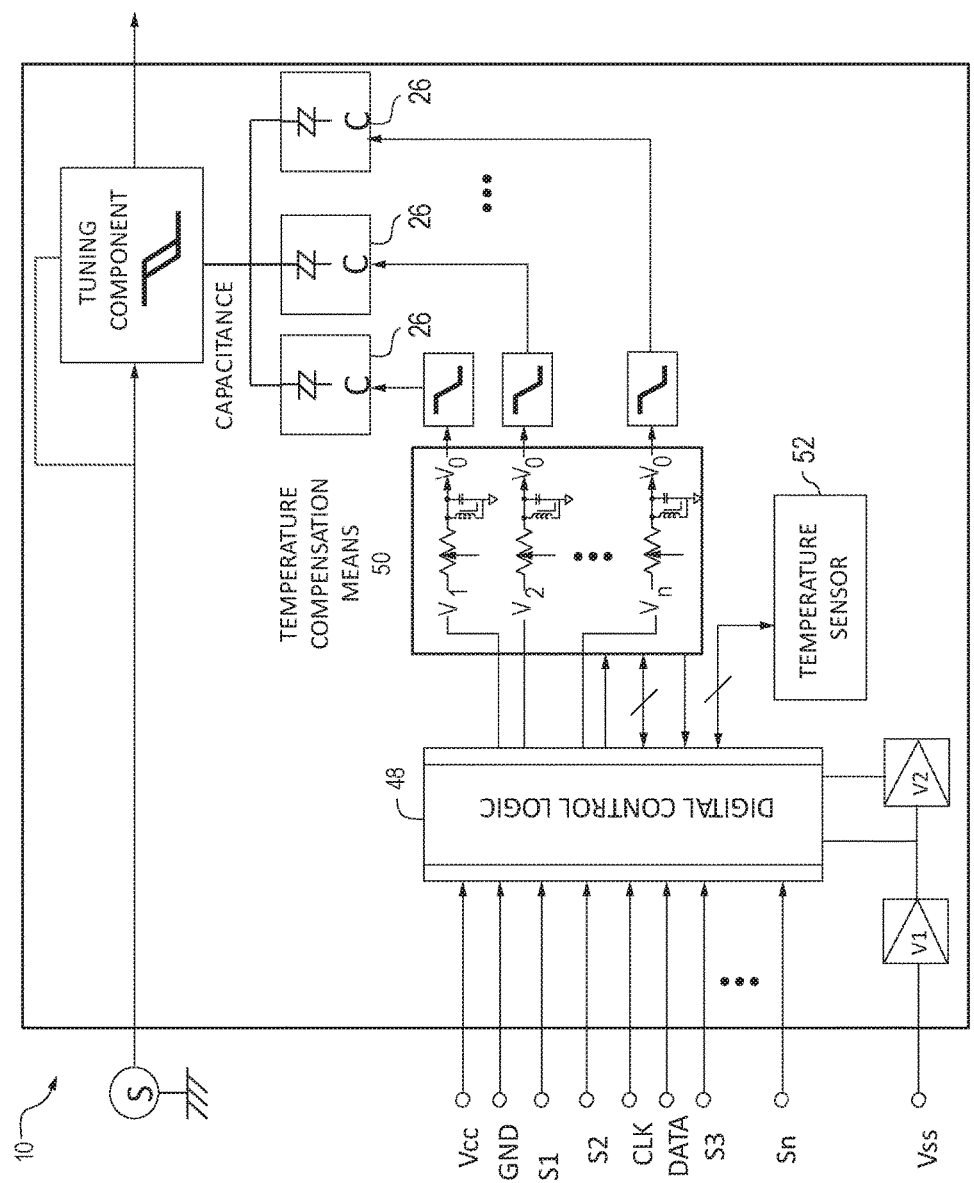
FIG. 7 is a diagrammatic view of a control means for a PCB embedded filter in accordance with one embodiment of the present invention.

Temperature compensation means 50 can operate through control logic 48, which can be located in QFP component 42. As shown in FIG. 7, temperature control means 50 can include a temperature sensor 52 that can measure the temperature of filter 10 and store the temperature reading in control logic 48. Sensor 52 can send information to control logic 48, which can adjust the DC voltage applied to capacitance component 26 (for variable capacitance) or the number of fixed capacitance component 26 to keep the center frequency of filter 10 approximately constant. Control logic 48 can include a look-up table of tuning values for controlling the capacitive tuning elements (e.g., capacitance component 26). Control logic 48 can also store a set of temperature offset values that can modify the tuning look-up values based on the temperature of filter 10. Depending on the types of elements used (e.g., capacitance component 26), the appropriate tuning look-up table and the temperature offset table can be written to and stored by control logic 48.

From the foregoing, it will be seen that this invention is one well adapted to attain all the ends and objects hereinabove set forth together with other advantages which are obvious and which are inherent to the structure. It will be understood that certain features and sub combinations are of utility and may be employed without reference to other features and sub combinations. This is contemplated by and is within the scope of the claims. Since many possible embodiments of the invention may be made without departing from the scope thereof, it is also to be understood that all matters herein set forth or shown in the accompanying drawings are to be interpreted as illustrative and not limiting.

Although an overview of the inventive subject matter has been described with reference to specific example embodiments, various modifications and changes may be made to these embodiments without departing from the broader spirit and scope of embodiments of the present invention. Such embodiments of the inventive subject matter may be referred to herein, individually or collectively, by the term "invention" merely for convenience and without intending to voluntarily limit the scope of this application to any single invention or inventive concept if more than one is, in fact, disclosed.

As is evident from the foregoing description, certain aspects of the inventive subject matter are not limited by the particular details of the examples illustrated herein, and it is therefore contemplated that other modifications and applications, or equivalents thereof, will occur to those skilled in the art. It is accordingly intended that the claims shall cover all such modifications and applications that do not depart from the spirit and scope of the inventive subject matter. Therefore, it is manifestly intended that this inventive subject matter be limited only by the following claims and equivalents thereof.

The Abstract is provided to comply with 37 C.F.R. § 1.72(b) to allow the reader to quickly ascertain the nature and gist of the technical disclosure. The Abstract is submitted with the understanding that it will not be used to limit the scope of the claims.

What is claimed is:

1. A device having multi-layered printed circuit boards interconnected with at least one microwave filter, the device comprising:
    a bottom material layer having a conductive material on one side;
    a lower cavity layer having a lower opening defined therethrough;
    a middle cavity layer having conductive sections of the printed circuit board interspersed with at least one air gap defined therethrough, wherein the combination of the conductive sections and the at least one air gap are fabricated to comprise the microwave filter;
    an upper cavity layer having an upper opening defined therethrough, wherein the lower opening and the upper opening define an air cavity with the middle cavity layer positioned therein;
    a routing material layer having a conducting material on one side; and
    an upper material layer having at least one capacitance component connected thererto, wherein the at least one capacitance component connects to at least one resonator of the microwave filter.

2. The device of claim 1, wherein the middle cavity layer is configured into a combline shape.

3. The device of claim 1, wherein the air cavity, the middle cavity layer and the at least one capacitance component collectively comprise a combline filter.

4. The device of claim 1, wherein at least two resonator rods are configured into an interdigital shape.

5. The device of claim 4, wherein the air cavity, the at least two resonator rods, and the at least one capacitance component collectively comprise the at least one microwave filter formed as an interdigital filter.

6. The device of claim 1, wherein the at least one resonator is configured into a suspended stripline shape.

7. The device of claim 1, wherein the air cavity, the at least one resonator and the at least one capacitance component collectively comprise the at least one microwave filter formed as a suspended substrate filter.

8. The device of claim 1 where a capacitance of the printed circuit board having variable values depended on the mechanical position of the cavity and resonator.

9. The device of claim 1, wherein the multi-layered printed circuit board is laminated on each surface of layers.

10. The device of claim 1, wherein the device is a tunable filter.

11. The device of claim 1 further comprising a temperature control means, wherein the temperature control means comprises:
    a temperature sensor; and
    a control logic component, wherein the control logic component configured for receiving a machine readable value from the temperature sensor and adjusting capacitance of the at least one capacitance component.

12. The device of claim 11, wherein the control logic component is configured to adjust a voltage level for changing the capacitance of the at least one capacitance component.

13. The device of claim 11, wherein the control logic component is configured to switch in differing capacitors of the device to change a capacitance presented to the resonators.

14. The device of claim 11, wherein the temperature control means is configured for maintaining an approximately constant center frequency of the device in the event of a temperature change of the device.

15. The device of claim 1, wherein the at least one capacitance component comprises at least one of a fixed capacitor, a varactor diode, a MEMS varactor or a switch capacitor array.

16. The device of claim 1, wherein the air cavity within the multi-layered printed circuit board has an upper boundary defined by the conductive material on the one side of the routing material layer and a lower boundary defined by the conductive material on the one side of the bottom material layer.

17. A printed circuit board package having one or more filters operable to compensate temperature variation, the printed circuit board package comprising:
   a multi-layered printed circuit board including one or more tunable filter components:
      a first layer having a conductive material onto a non-conductive substrate;
      a second layer having an opening section having a capacitance characteristic, wherein the second layer comprises at least two parts of an upper layer and a lower layer having the opening section, air gaps, and metallic coated areas;
      a third layer having plurality of metalized sections and spaces interspersed, positioned between the upper and lower layers of the second layer; and
      a fourth layer having at least one processor and electric components connected thererto, wherein the forth layer includes a routing layer having a conducting material on one side and one or more holes metallic connectable the other side.

18. The device of claim 17, wherein the multi-layered printed circuit board further comprises:
   one or more microwave filter sections; and
   one or more resonator sections, wherein the one or more microwave filter sections comprise a combination of metalized sections and cavities.

19. The device of claim 17, wherein the processor is coupled to sensors, capacitors, or integrated circuitries.

20. The device of claim 17, wherein the processor is configured to adjust the filter characteristics based on the temperature variation values received from sensors.

* * * * *